United States Patent
Lubashevsky et al.

(10) Patent No.: US 11,796,925 B2
(45) Date of Patent: Oct. 24, 2023

(54) SCANNING OVERLAY METROLOGY USING OVERLAY TARGETS HAVING MULTIPLE SPATIAL FREQUENCIES

(71) Applicant: KLA Corporation, Milpitas, CA (US)

(72) Inventors: Yuval Lubashevsky, Haifa (IL); Itay Gdor, Tel-Aviv (IL); Daria Negri, Nesher (IL); Eitan Hajaj, Tel Aviv (IL)

(73) Assignee: KLA Corporation, Milpitas, CA (US)

( * ) Notice: Subject to any disclaimer, the term of this patent is extended or adjusted under 35 U.S.C. 154(b) by 36 days.

(21) Appl. No.: 17/709,104

(22) Filed: Mar. 30, 2022

(65) Prior Publication Data

US 2023/0213875 A1 Jul. 6, 2023

Related U.S. Application Data

(60) Provisional application No. 63/295,959, filed on Jan. 3, 2022.

(51) Int. Cl.
*G03F 7/20* (2006.01)
*G01B 9/02* (2022.01)
*G03F 7/00* (2006.01)

(52) U.S. Cl.
CPC ..... *G03F 7/70633* (2013.01); *G01B 9/02041* (2013.01)

(58) Field of Classification Search
CPC ..... G03F 7/70633; G01B 11/24; G01B 11/27; G01B 11/272; G01B 9/02041; H01L 22/12
See application file for complete search history.

(56) References Cited

U.S. PATENT DOCUMENTS

| 4,947,413 | A | 8/1990 | Jewell et al. |
| 5,216,257 | A | 6/1993 | Brueck et al. |

(Continued)

FOREIGN PATENT DOCUMENTS

| CN | 111766764 A | 10/2020 |
| JP | 214765 Y1 | 8/1998 |

(Continued)

OTHER PUBLICATIONS

Korean Intellectual Property Office, International Search Report and Written Opinion for International Application No. PCT/US2022/052061, dated Apr. 24, 2023, 10 pages.

(Continued)

*Primary Examiner* — Gordon J Stock, Jr.
(74) *Attorney, Agent, or Firm* — Suiter Swantz pc llo

(57) ABSTRACT

An overlay metrology system may include an illumination source and illumination optics to illuminate an overlay target on a sample with illumination from the illumination source as the sample is in motion with respect to the illumination from the illumination source in accordance with a measurement recipe. The overlay target may include one or more cells, where a single cell is suitable for measurement along a particular direction. Such a cell may include two or more gratings with different pitches. Further, the system may include two or more photodetectors, each configured to capture three diffraction lobes from the two or more grating structures. The system may further include a controller to determine an overlay measurement associated with each cell of the overlay target.

22 Claims, 11 Drawing Sheets

(56) References Cited

U.S. PATENT DOCUMENTS

| | | |
|---|---|---|
| 5,414,514 A | 5/1995 | Smith et al. |
| 5,808,731 A | 9/1998 | Kirk |
| 5,895,735 A | 4/1999 | Yoon |
| 5,914,204 A | 6/1999 | Lee |
| 6,958,819 B1 | 10/2005 | Heaton et al. |
| 7,247,843 B1 | 7/2007 | Moon |
| 7,440,105 B2 | 10/2008 | Adel et al. |
| 7,602,491 B2 | 10/2009 | Kandel et al. |
| 8,786,825 B2 | 7/2014 | Kerkhof et al. |
| 9,123,649 B1 | 9/2015 | Manassen et al. |
| 9,864,209 B2 | 1/2018 | Levinski et al. |
| 10,197,389 B2 | 2/2019 | Levinski et al. |
| 10,437,163 B2 * | 10/2019 | Van Der Schaar ... G03F 9/7046 |
| 10,488,768 B2 | 11/2019 | Auer et al. |
| 10,527,952 B2 * | 1/2020 | Grunzweig ......... G03F 7/70683 |
| 10,585,357 B2 | 3/2020 | Schaar et al. |
| 10,606,178 B2 * | 3/2020 | Zwier ................... G03F 7/7065 |
| 10,691,030 B2 * | 6/2020 | Staals ................ G03F 7/70683 |
| 10,824,079 B2 | 11/2020 | Lubashevsky et al. |
| 10,983,005 B2 * | 4/2021 | Wu ........................ G01J 3/2803 |
| 11,073,768 B2 | 7/2021 | Hill et al. |
| 11,112,369 B2 * | 9/2021 | Gready ................... H01L 22/12 |
| 11,119,417 B2 * | 9/2021 | Manassen ............ G01B 9/0201 |
| 11,164,307 B1 | 11/2021 | Feler et al. |
| 11,300,405 B2 * | 4/2022 | Manassen .......... G01B 9/02027 |
| 11,353,799 B1 * | 6/2022 | Volkovich ........... G03F 7/70625 |
| 11,526,086 B2 * | 12/2022 | Hill .................... G01N 21/9501 |
| 11,604,149 B2 * | 3/2023 | Feler ................. G01N 21/9501 |
| 2001/0021477 A1 | 9/2001 | Dirksen et al. |
| 2002/0080364 A1 | 6/2002 | Monshouwer et al. |
| 2004/0169861 A1 | 9/2004 | Mieher et al. |
| 2005/0195398 A1 | 9/2005 | Adel et al. |
| 2007/0077503 A1 | 4/2007 | Yoo |
| 2007/0234786 A1 | 10/2007 | Moon |
| 2007/0242272 A1 | 10/2007 | Suehira et al. |
| 2007/0279630 A1 | 12/2007 | Kandel et al. |
| 2009/0042108 A1 | 2/2009 | Yasuzato |
| 2010/0267682 A1 | 10/2010 | Johri et al. |
| 2010/0277706 A1 | 11/2010 | Schaar et al. |
| 2011/0122496 A1 | 5/2011 | Schaar et al. |
| 2012/0033193 A1 | 2/2012 | Schaar et al. |
| 2012/0253325 A1 | 10/2012 | Sniffin et al. |
| 2013/0032712 A1 | 2/2013 | Shih et al. |
| 2013/0193602 A1 | 8/2013 | Suzuki et al. |
| 2013/0252429 A1 | 9/2013 | Okamoto et al. |
| 2014/0065736 A1 | 3/2014 | Amir et al. |
| 2014/0240704 A1 | 8/2014 | Komine et al. |
| 2015/0138523 A1 | 5/2015 | Jak et al. |
| 2015/0235880 A1 | 8/2015 | Inada et al. |
| 2016/0300767 A1 | 10/2016 | Ko et al. |
| 2017/0146338 A1 | 5/2017 | Allen |
| 2017/0307367 A1 | 10/2017 | Yaegashi et al. |
| 2017/0351184 A1 | 12/2017 | Peng et al. |
| 2018/0024054 A1 | 1/2018 | Moon et al. |
| 2018/0246420 A1 | 8/2018 | Pandey et al. |
| 2019/0004439 A1 | 1/2019 | Lubashevsky et al. |
| 2019/0033726 A1 | 1/2019 | Adam et al. |
| 2019/0049373 A1 | 2/2019 | Levinski |
| 2019/0101835 A1 | 4/2019 | Chen |
| 2019/0219931 A1 | 7/2019 | Zwier |
| 2019/0285996 A1 | 9/2019 | Shibayama et al. |
| 2019/0354024 A1 | 11/2019 | Tsiatmas et al. |
| 2020/0132446 A1 | 4/2020 | Shalibo et al. |
| 2021/0072650 A1 | 3/2021 | Feler et al. |
| 2021/0364279 A1 | 11/2021 | Manassen et al. |
| 2021/0364935 A1 | 11/2021 | Gdor et al. |
| 2022/0034652 A1 | 2/2022 | Manassen et al. |
| 2022/0252990 A1 * | 8/2022 | Javaheri ............. G01B 11/0625 |
| 2023/0133640 A1 * | 5/2023 | Hill ..................... G03F 7/70633 |
| | | 356/615 |

FOREIGN PATENT DOCUMENTS

| | | |
|---|---|---|
| JP | 2001093820 A | 4/2001 |
| JP | 2002134394 A | 5/2002 |
| JP | 2007140460 | 2/2009 |
| JP | 2010267682 A | 11/2010 |
| JP | 2011243664 A | 12/2011 |
| JP | 2012253325 A | 12/2012 |
| JP | 2013074258 A | 4/2013 |
| JP | 2013254780 | 7/2015 |
| JP | 2015154008 A | 8/2015 |
| KR | 1020160121206 A | 10/2016 |

OTHER PUBLICATIONS

Adel, Mike et al., "Diffraction order control in overlay metrology: a review of the roadmap options," Proc. SPIE. 6922, Metrology, Inspection, and Process Control for Microlithography XXII, 692202 (2008).

Buttgereit, et al., "Phame(R)—high resolution off-axis phase shift measurements on 45nm node features," 24th European Mask and Lithography Conference, 2008, pp. 1-7, doi: 10.1117/12.798805.

Di, et al., "Moiré-Based Absolute Interferometry With Large Measurement Range in Wafer-Mask Alignment", IEEE Photonics Technology Letters, vol. 27, No. 4, pp. 435-438, 2015. doi:10.1109/LPT.2014.2377037.

Fesperman Jr., Ronnie Rex, (2006). Multiscale Alignment and Positioning System. (UMI 3264369) [Doctor of Philosophy, University of North Carolina] ProQuest Information and Learning Company.

Kikuchi et al., "Principle and observation of fluorescence moiré fringes for alignment in print and imprint methods" J. Vac. Sci. Technol. B 35, 06G303 (2017); https://doi.org/10.1116/1.4990844, Submitted: Jun. 19, 2017 . Accepted: Aug. 31, 2017 . Published Online: Sep. 26, 2017.

Moon, et al., "Immunity to Signal Degradation by Overlayers Using a Novel Spatial-Phase-Matching Alignment System", J. Vac. Sci. Technol. B 13, 2648-2652 (1995).

Servin, et al., "Mask contribution on CD & OVL errors budgets for Double Patterning Lithography," 25th European Mask and Lithography Conference, 2009, pp. 1-13.

Wu, et al., (2012). Nanoimprint lithography with ≤60 nm overlay precision. Applied Physics A, 106, 767-772.

Zhou, et al., (2015). Moiré-Based Interferometry for Magnification Calibration of Bitelecentric Lens System. IEEE Photonics Journal. 7. 1-11. 10.1109/JPHOT.2015.2500892.

Zhou, et al., "Fourier-based analysis of moiré fringe patterns of superposed gratings in alignment of nanolithography", Optics Express, vol. 16, No. 11, p. 7869, 2008. doi: 10.1364/OE.16.007869.

Zhu et al. Four-quadrant gratings moiré fringe alignment measurement in proximity lithography. Optics Express. Feb. 2013;21(3):3463-3473. DOI: 10.1364/oe.21.003463. PMID: 23481804.

Zhu, et al., (2015). Adjustment Strategy for Inclination Moiré Fringes in Lithography by Spatial Frequency Decomposition. IEEE Photonics Technology Letters. 27. 395-398. 10.1109/LPT.2014.2370072.

Korean Intellectual Property Office, International Search Report and Written Opinion for International Application No. PCT/US2023/013654, dated Jun. 8, 2023, 12 pages.

Korean Intellectual Property Office, International Search Report and Written Opinion for International Application No. PCT/US2023/014005, dated Jun. 16, 2023, 8 pages.

* cited by examiner

SCANNING OVERLAY METROLOGY USING OVERLAY TARGETS HAVING MULTIPLE SPATIAL FREQUENCIES

CROSS-REFERENCE TO RELATED APPLICATION

The present application claims the benefit under 35 U.S.C. § 119(e) of U.S. Provisional Application Ser. No. 63/295,959, filed Jan. 3, 2022, entitled NEW OVL METROLOGY TARGET DESIGN FOR SCANNING SCATTEROMETRY OPTICAL TARGET, naming Itay Gdor, Yuval Lubashevsky, Daria Negri, and Eitan Hajaj, which is incorporated herein by reference in the entirety.

TECHNICAL FIELD

The present disclosure is directed to overlay metrology and, more particularly, to scanning overlay metrology.

BACKGROUND

Increasing demands for smaller semiconductor devices is resulting in corresponding increased demand for accurate and efficient metrology. One approach to increasing the efficiency and throughput of a metrology tool is to generate metrology data on a sample as it is in motion rather than in a static location in a measurement field of view. In this way, time delays associated with settling of the translation stage prior to a measurement may be eliminated or reduced. However, increasing the sensitivity and throughput of such measurements remains a central challenge to such scanning metrology methods. Therefore, it is desirable to provide systems and methods for curing the above deficiencies.

SUMMARY

An overlay metrology system is disclosed in accordance with one or more illustrative embodiments. In one illustrative embodiment, the system includes an illumination source. In another illustrative embodiment, the system includes an illumination sub-system with one or more illumination optics to illuminate an overlay target on a sample with illumination from the illumination source as the sample is in motion with respect to the illumination from the illumination source in accordance with a measurement recipe. In another illustrative embodiment, the overlay target includes one or more cells in accordance with the measurement recipe, where at least some of the cells include a double grating with a first series of features distributed along a measurement direction with a first pitch and a second pitch in an overlapping region and further include a single grating with a second series of features distributed along the measurement direction with the first pitch. In another illustrative embodiment, the system includes a collection sub-system with one or more collection optics to direct positive and negative first-order diffraction of the illumination by both the double grating and the single gratings associated with the first and second pitches to one or more detectors located in a pupil plane in accordance with the measurement recipe, where the one or more detectors generate time-varying interference signals associated with the positive and negative first-order diffraction of the illumination by both the double grating and the single gratings. In another illustrative embodiment, the system includes a controller to determine an overlay measurement between the double grating and the single grating based on the time-varying interference signals.

An overlay target is disclosed in accordance with one or more illustrative embodiments. In one illustrative embodiment, the target includes one or more cells on a sample, where at least some of the cells include a double grating with a first series of features distributed along a measurement direction with a first pitch and a second pitch in an overlapping region, and further include a single grating on a second layer of the sample with a second series of features distributed along the measurement direction with the first pitch. In another illustrative embodiment, the first and second pitches are selected such that positive first-order diffraction from the first and second pitches overlap in a first overlap angular region and negative first-order diffraction from the first and second pitches overlap in a second overlap angular region for at least one operational wavelength. In another illustrative embodiment, time-varying interference signals in the first and second overlap regions generated as the overlay target is scanned relative to an illumination beam are indicative of overlay between the double grating and the single grating.

An overlay metrology system is disclosed in accordance with one or more illustrative embodiments. In one illustrative embodiment, the system includes an illumination source. In another illustrative embodiment, the system includes an illumination sub-system with one or more illumination optics to illuminate an overlay target on a sample with illumination from the illumination source as the sample is in motion with respect to the illumination from the illumination source in accordance with a measurement recipe. In another illustrative embodiment, the overlay target includes one or more cells in accordance with the measurement recipe, where at least some of the cells include a first grating on a first layer of the sample with a first series of features distributed along a measurement direction with a first pitch, and a second grating on a second layer of the sample with a second series of features distributed along the measurement direction with a second pitch different than the first pitch. In another illustrative embodiment, the system includes a collection sub-system with one or more collection optics to direct measurement diffraction orders to one or more detectors at a pupil plane in accordance with the measurement recipe, where the measurement diffraction orders include positive and negative first-order diffraction of the illumination by the first grating, and positive and negative first-order diffraction and second-order diffraction of the illumination by the second grating. In another illustrative embodiment, the system includes a controller to determine an overlay measurement between the first and second layers of the sample based on the measurement diffraction orders.

An overlay target is disclosed in accordance with one or more illustrative embodiments. In one illustrative embodiment, the target includes one or more cells on a sample, where at least some of the cells include a first grating on a first layer of the sample including a first series of features distributed along a measurement direction with a first pitch, and a second grating on a second layer of the sample including a second series of features distributed along the measurement direction with a second pitch different than the first pitch. In another illustrative embodiment, the first and second pitches are selected such that positive first-order diffraction from the first grating overlaps with positive first and second order diffraction from the second grating in a first set of overlap regions, where the negative first-order diffraction from the first grating overlaps with negative first and second order diffraction from the second grating in a second set of overlap regions. In another illustrative embodiment, time-varying interference signals in the first and second sets of overlap regions are indicative of overlay between the first and second layers of the sample.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

DETAILED DESCRIPTION

Figure 1A:
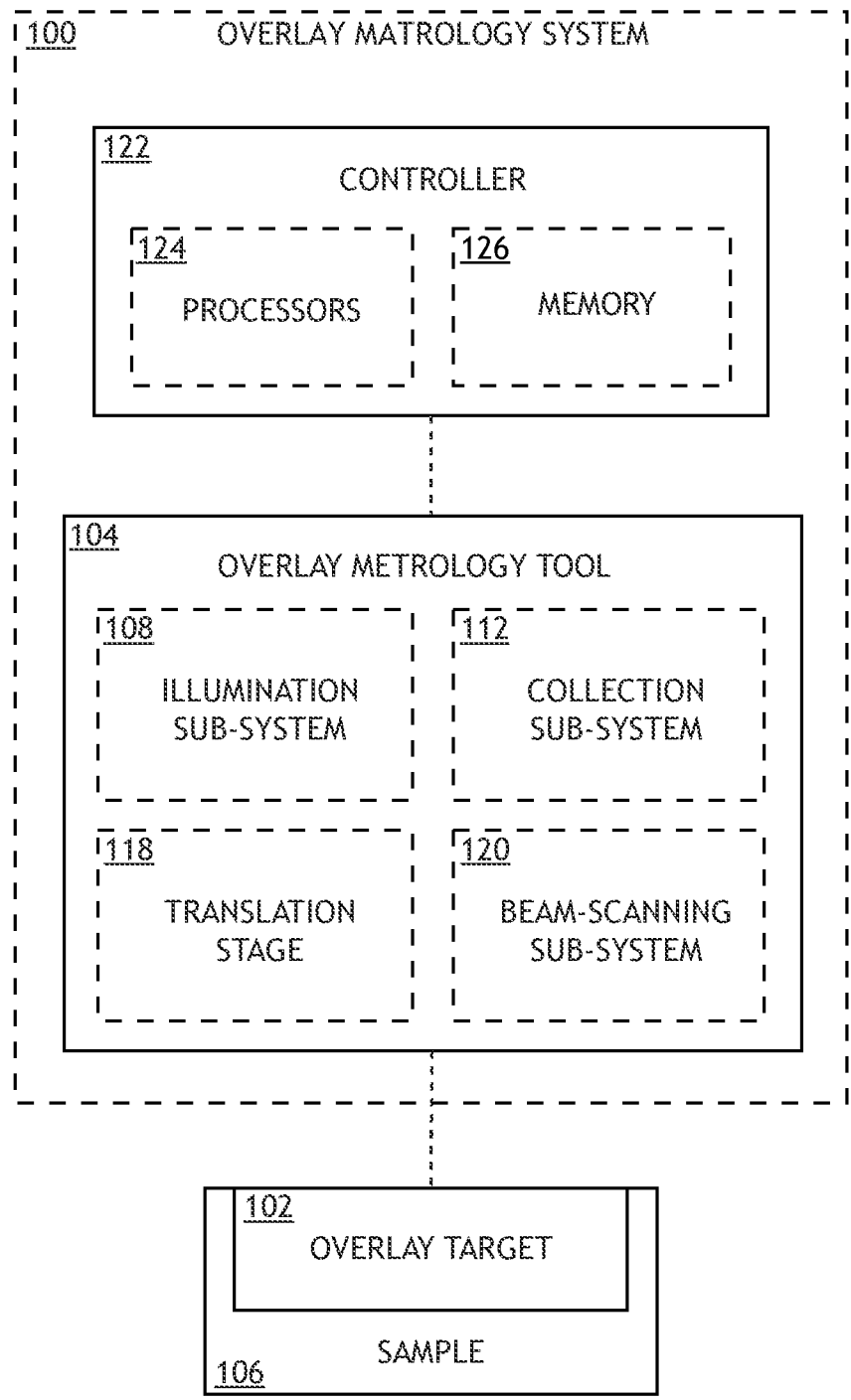
FIG. 1A is a conceptual view of a system for performing scatterometry overlay metrology on an overlay target suitable for single-cell measurements along any particular measurement direction, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for single-cell scanning overlay metrology. In particular, some embodiments of the present disclosure are directed to overlay targets suitable for single-cell scanning overlay metrology and some embodiments are directed to overlay metrology tools suitable for generating overlay measurements by characterizing such targets.

In some embodiments, an overlay target suitable for single-cell scanning overlay metrology includes a cell with grating structures associated with two lithographic exposures oriented with pitches along a particular measurement direction, where the grating structures may be in the same or different layers of a sample. Further, an overlay metrology tool suitable for generating an overlay measurement associated with the two lithographic exposures may include two photodetectors, where each is arranged (e.g., in a pupil plane) to capture at least a portion of three diffraction lobes from the grating structures). For example, a first photodetector may capture at least a portion of three positive-order diffraction lobes and a second photodetector may capture at least a portion of three negative-order diffraction lobes. It is contemplated herein that an overlay measurement along the measurement direction between the two lithographic exposures may be generated based on differences between time-varying interference signals captured by the photodetectors as the sample is scanned.

Additionally, an overlay target may include multiple cells having grating structures oriented along different measurement directions to provide overlay measurements along the different measurement directions.

It is recognized herein that many scatterometry overlay metrology techniques generally determine overlay by illuminating an overlay target having grating structures in two layers (e.g., grating-over-grating structures), where an overlay measurement is based on asymmetries between positive and negative diffraction orders. For example, various scatterometry techniques are described in U.S. Patent Publication No. 2021/0364279 published on Mar. 11, 2021; U.S. Pat. No. 10,824,079 issued on Nov. 3, 2020; U.S. Pat. No. 10,197,389 issued on Feb. 9, 2019; and Adel, et al., "Diffraction order control in overlay metrology: a review of the roadmap options," Proc. SPIE. 6922, Metrology, Inspection, and Process Control for Microlithography XXII, 692202. (2008); all of which are incorporated herein by reference in their entireties.

However, existing scatterometry overlay techniques typically require or benefit from measurements of two or more cells having different configurations of grating structures. For example, different cells may include grating structures with different intentional overlay offsets. By way of another example, an overlay target including grating structures with different pitches may include different cells in which the constituent pitches are provided in different layers.

Embodiments of the present disclosure are directed to scanning overlay metrology using an overlay target suitable for providing an overlay measurement along with a single cell per overlay measurement. It is contemplated herein that single-cell measurements may provide higher measurement throughput than multi-cell measurements.

In some embodiments, a cell of an overlay target suitable for single-cell scanning overlay metrology includes a single-pitch grating on one layer and a double-pitch grating (e.g., a double grating) on another layer. For example, a double-pitch grating may be functionally characterized by two grating structures with different pitches that overlap on a common area of a sample layer. However, it is to be understood that the constituent features of a double-pitch grating are fabricated with a common lithographic exposure. In this way, the characterization of a double grating as being formed from two grating structures with different pitches is purely conceptual and overlapping portions of the two grating structures with different pitches are formed as common elements.

It is contemplated herein that illuminating a double-pitch grating may generate two sets of diffraction orders associated with the two constituent pitches. Further, illuminating an overlay target (or a cell therein) with both a single-pitch grating and a double-pitch grating may generate three sets of diffraction orders.

In some embodiments, the pitches of the single-pitch and double-pitch gratings are selected such that the first-order diffraction lobes associated with the three selected pitches at least partially overlap (e.g., in a pupil plane). For example, +1 order diffraction lobes associated with the three pitches may at least partially overlap in a first location of a pupil plane and −1 order diffraction lobes associated with the three pitches may at least partially overlap in a second location of the pupil plane. It is contemplated herein that photodetectors placed at the first and second locations in the pupil plane may capture time-varying interference signals as the sample is scanned, where an overlay measurement between the single-pitch and double-pitch gratings may be generated based on differences between these time-varying interference signals. It is further contemplated herein that such an overlay measurement may be similar to the overlay measurements associated with triple-grating targets generally described in U.S. patent application Ser. No. 17/119,536 filed on Dec. 11, 2020, which is incorporated herein by reference in its entirety. However, it is noted that that an overlay target including a single-pitch grating and a double-pitch grating as disclosed herein may have several advantages over a triple-grating overlay target described in U.S. patent application Ser. No. 17/119,536 filed on Dec. 11, 2020 incorporated and referenced above. In particular, an overlay target including a single-pitch grating and a double-pitch grating as disclosed herein may avoid undesirable edge-diffraction and scattering effects associated with the triple-grating structures.

In some embodiments, a cell of an overlay target suitable for single-cell scanning overlay metrology includes two single-pitch gratings with different pitches (e.g., a first pitch and a second pitch), where first-order diffraction lobes associated with the first pitch overlap portions of both first and second-order diffraction associated with the second pitch. For example, a +1 order diffraction lobe associated with the first pitch ($D_{P_1,+1}$) may partially overlap with both +1 and +2 diffraction lobes associated with the second pitch ($D_{P_2,+1}$ and $D_{P_2,+2}$). Similarly, a −1 order diffraction lobe associated with the first pitch ($D_{P_1,-1}$) may partially overlap with both −1 and −2 diffraction lobes associated with the second pitch ($D_{P_2,-1}$ and $D_{P_2,-2}$). In some embodiments, an overlay metrology tool includes a first photodetector placed in a first location of the pupil plane with a size suitable for capturing the overlap of $D_{P_1,+1}$ with both $D_{P_2,+1}$ and $D_{P_2,+2}$ and a second photodetector placed in a first location of the pupil plane with a size suitable for capturing the overlap of $D_{P_1,-1}$ with both $D_{P_2,-1}$ and $D_{P_2,-2}$. It is contemplated herein that such first and second photodetectors may capture time-varying interference signals as the sample is scanned, where an overlay measurement between the two single-pitch gratings may be generated based on these time-varying interference signals.

Some embodiments of the present disclosure are directed to providing recipes for configuring an overlay metrology tool to facilitate an overlay measurement based on selected diffraction orders. An overlay metrology tool is typically configurable according to a recipe including a set of parameters for controlling various aspects of an overlay measurement such as, but not limited to, the illumination of a sample, the collection of light from the sample, or the position of the sample during a measurement. In this way, the overlay metrology tool may be configured to provide a selected type of measurement for one or more overlay target designs of interest. For example, a metrology recipe may include illumination parameters such as, but not limited to, an illumination wavelength, an illumination pupil distribution (e.g., a distribution of illumination angles and associated intensities of illumination at those angles), a polarization of incident illumination, or a spatial distribution of illumination. By way of another example, a metrology recipe may include collection parameters such as, but not limited to, a collection pupil distribution (e.g., a desired distribution of angular light from the sample to be used for a measurement and associated filtered intensities at those angles), collection field stop settings to select portions of the sample of interest, polarization of collected light, wavelength filters, or parameters for controlling one or more detectors. By way of a further example, a metrology recipe may include various parameters associated with the sample position during a measurement such as, but not limited to, a sample height, a sample orientation, whether a sample is static during a measurement, or whether a sample is in motion during a measurement (along with associated parameters describing the speed, scan pattern, or the like).

Referring now to FIGS. 1A-4B, systems and methods for single-cell scanning scattering overlay metrology is described in greater detail, in accordance with one or more embodiments of the present disclosure.

Figure 1B:
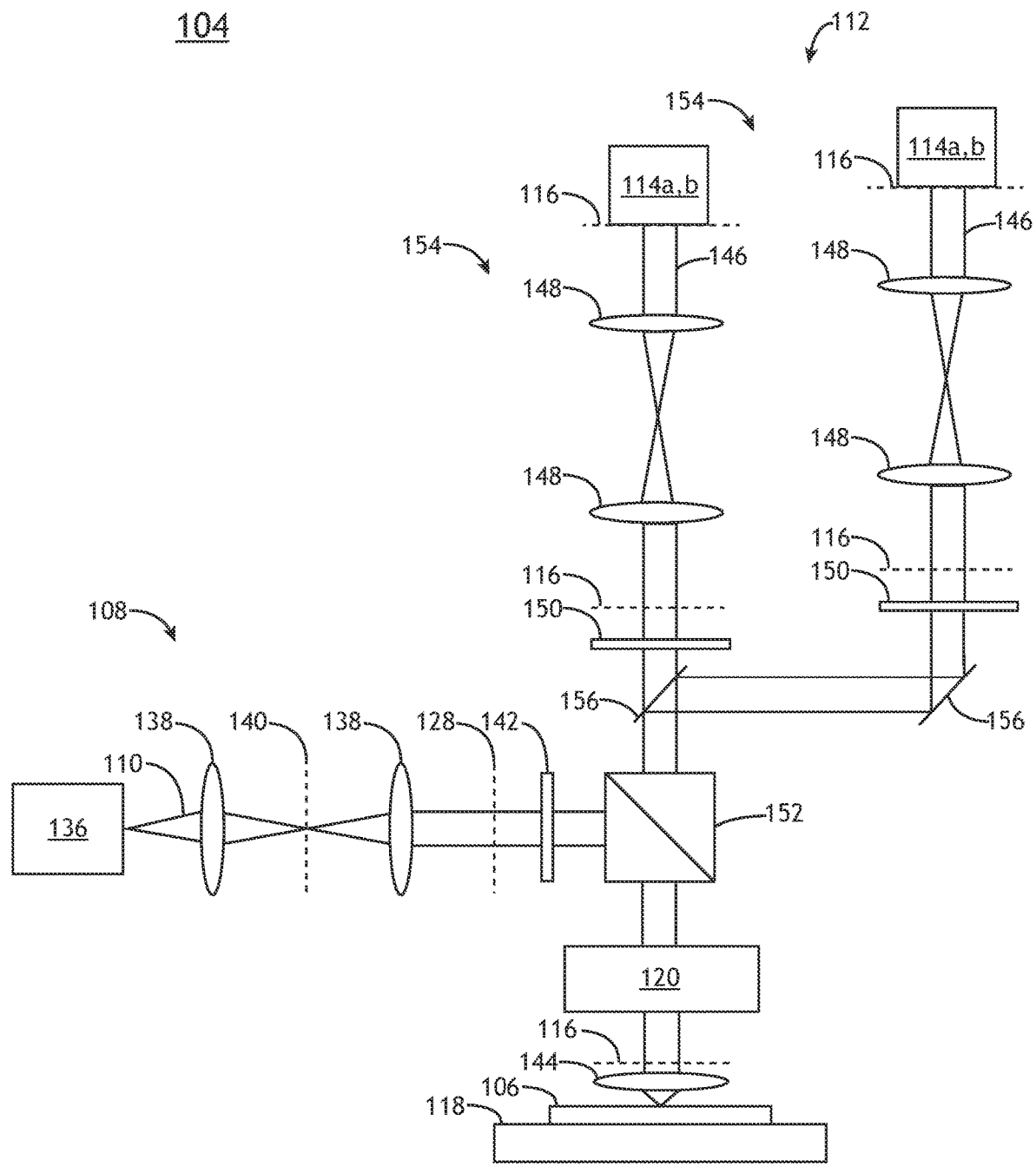
FIG. 1B is a schematic view of the overlay metrology tool in accordance with one or more embodiments of the present disclosure.

FIG. 1A is a conceptual view of an overlay metrology system 100 for performing scatterometry overlay metrology on an overlay target 102 suitable for single-cell measurements along any particular measurement direction, in accordance with one or more embodiments of the present disclosure. In some embodiments, the overlay metrology system 100 includes an overlay metrology tool 104 to perform scatterometry overlay measurements on overlay targets 102 distributed across a sample 106. FIG. 1B is a schematic view of the overlay metrology tool 104 in accordance with one or more embodiments of the present disclosure.

For the purposes of the present disclosure, the term overlay is generally used to describe relative positions of features on a sample fabricated by two or more lithographic patterning steps, where the term overlay error describes a deviation of the features from a nominal arrangement. In this context, an overlay measurement may be expressed as either a measurement of the relative positions or of an overlay error associated with these relative positions. For example, a multi-layered device may include features patterned on multiple sample layers using different lithography steps for each layer, where the alignment of features between layers must typically be tightly controlled to ensure proper performance of the resulting device. Accordingly, an overlay measurement may characterize the relative positions of features on two or more of the sample layers. By way of another example, multiple lithography steps may be used to fabricate features on a single sample layer. Such techniques, commonly called double-patterning or multiple-patterning techniques, may facilitate the fabrication of highly dense features near the resolution of the lithography system. An overlay measurement in this context may characterize the relative positions of the features from the different lithography steps on this single layer. It is to be understood that examples and illustrations throughout the present disclosure relating to a particular application of overlay metrology are provided for illustrative purposes only and should not be interpreted as limiting the disclosure.

Further, the term scatterometry metrology is used herein to broadly encompass the terms scatterometry-based metrology and diffraction-based metrology in which a sample having periodic features on one or more sample layers is illuminated with an illumination beam having a limited angular extent and one or more distinct diffraction orders are collected for the measurement. Additionally, the term scanning metrology is used to describe metrology measurements generated when a sample is in motion relative to illumination used for a measurement. In a general sense, scanning metrology may be implemented by moving the sample, the illumination, or both. In this way, specific descriptions herein of a particular technique for implementing scanning metrology are solely illustrative and should not be interpreted as limiting.

In some embodiments, the overlay metrology tool 104 includes an illumination sub-system 108 to generate illumination in the form of one or more illumination beams 110 to illuminate the sample 106 and a collection sub-system 112 to collect light from the illuminated sample 106. For example, the one or more illumination beams 110 may be angularly limited on the sample 106 such that grating structures in one or more cells of the overlay target 102 may generate discrete diffraction orders. Further, the one or more illumination beams 110 may be spatially limited such that they may illuminate selected portions of the overlay target 102. For instance, each of the one or more illumination beams 110 may be spatially limited to illuminate a particular cell of an overlay target. In some embodiments, the one or more illumination beams 110 underfill a particular cell of an overlay target.

The collection sub-system 112 may then collect at least some diffraction orders associated with diffraction of the illumination beam 110 from an overlay target 102. Further, the collection sub-system 112 may include at least two photodetectors 114a,b positioned in a collection pupil plane 116 at locations associated with time-varying interference signals indicative of overlay. For example, as will be described in greater detail below, suitable locations for the photodetectors 114 may include, but are not limited to, locations proving capture of three diffraction orders from grating structures within the overlay target 102.

In some embodiments, the overlay metrology tool 104 includes a translation stage 118 to scan the sample 106 through a measurement field of view of the overlay metrology tool 104 during a measurement to implement scanning metrology. In some embodiments, the overlay metrology tool 104 includes a beam-scanning sub-system 120 configured to modify or otherwise control a position of at least one illumination beam 110 on the sample 106. For example, the beam-scanning sub-system 120 may scan an illumination beam 110 in a direction orthogonal to a scan direction (e.g., a direction in which the translation stage 118 scans the sample 106) during a measurement. In this way, a scanning measurement may be performed by any relative motion of the sample 106 and an illumination beam 110.

In some embodiments, the overlay metrology system 100 includes a controller 122 communicatively coupled to the overlay metrology tool 104. The controller 122 may include one or more processors 124 and a memory device 126, or memory. For example, the one or more processors 124 may be configured to execute a set of program instructions maintained in the memory device 126. In this way, the controller 122 may implement any of the various process steps described throughout the present disclosure such as, but not limited to, receiving time-varying interference signals from the photodetectors 114, processing or filtering the time-varying interference signals, or generating overlay measurements associated with the sample 106 based on the time-varying interference signals.

Figure 2:
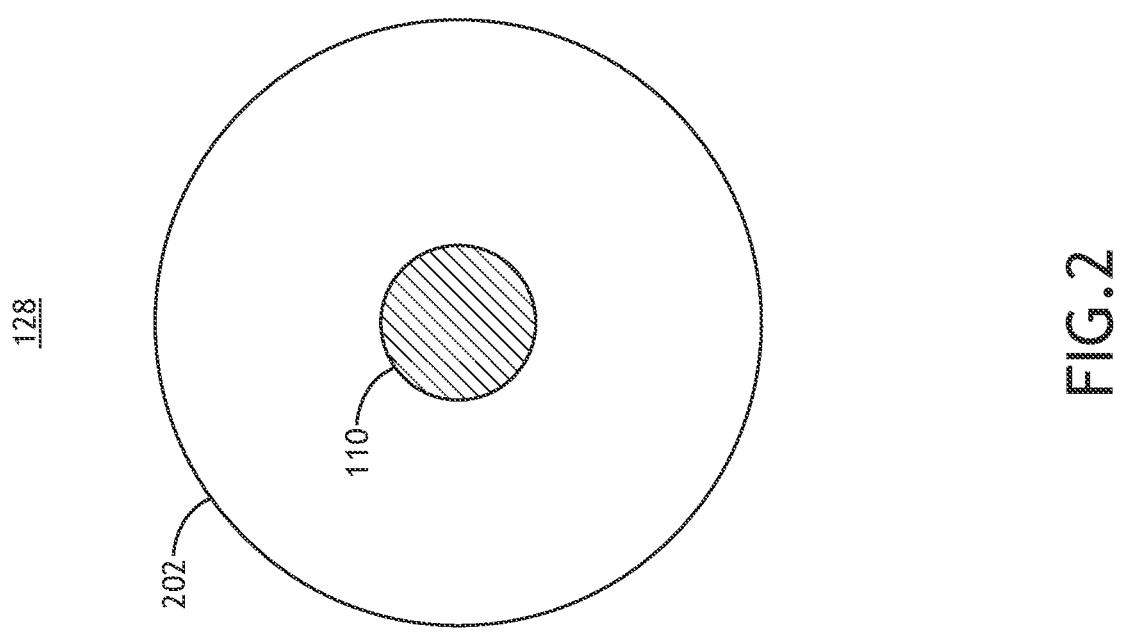
FIG. 2 is a top view of an illumination pupil plane of the overlay metrology tool, in accordance with one or more embodiments of the present disclosure.
Figure 3A:
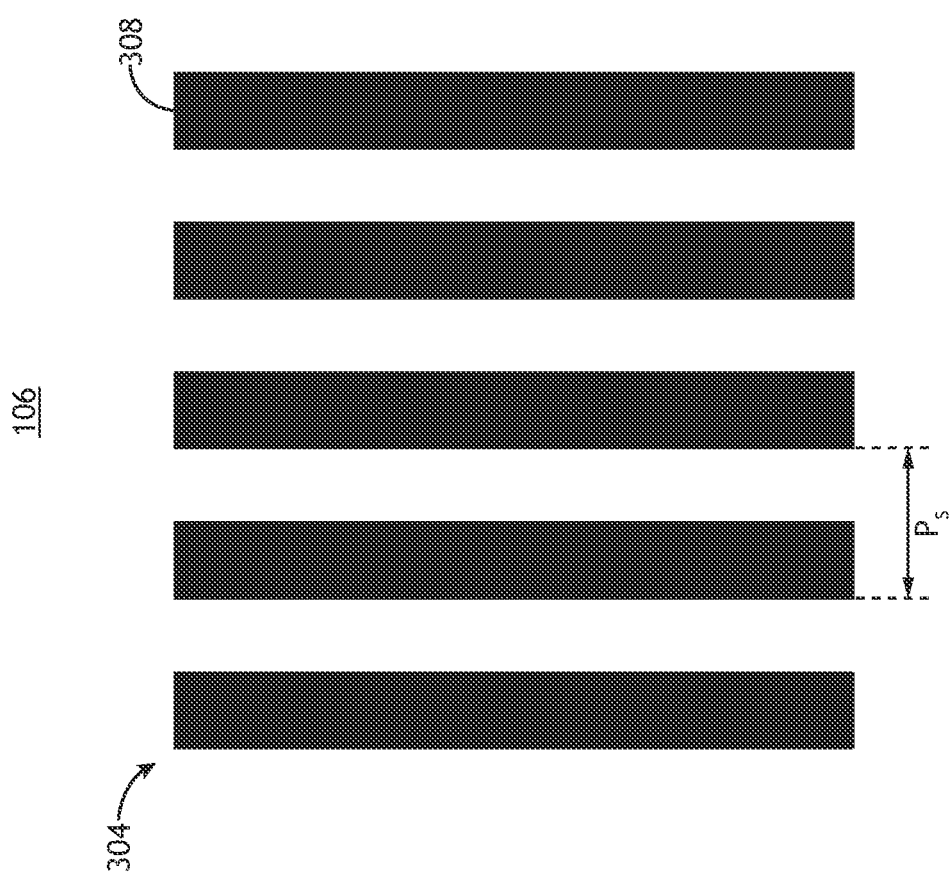
FIG. 3A is a top view of a single-pitch grating, in accordance with one or more embodiments of the present disclosure.
Figure 3B:
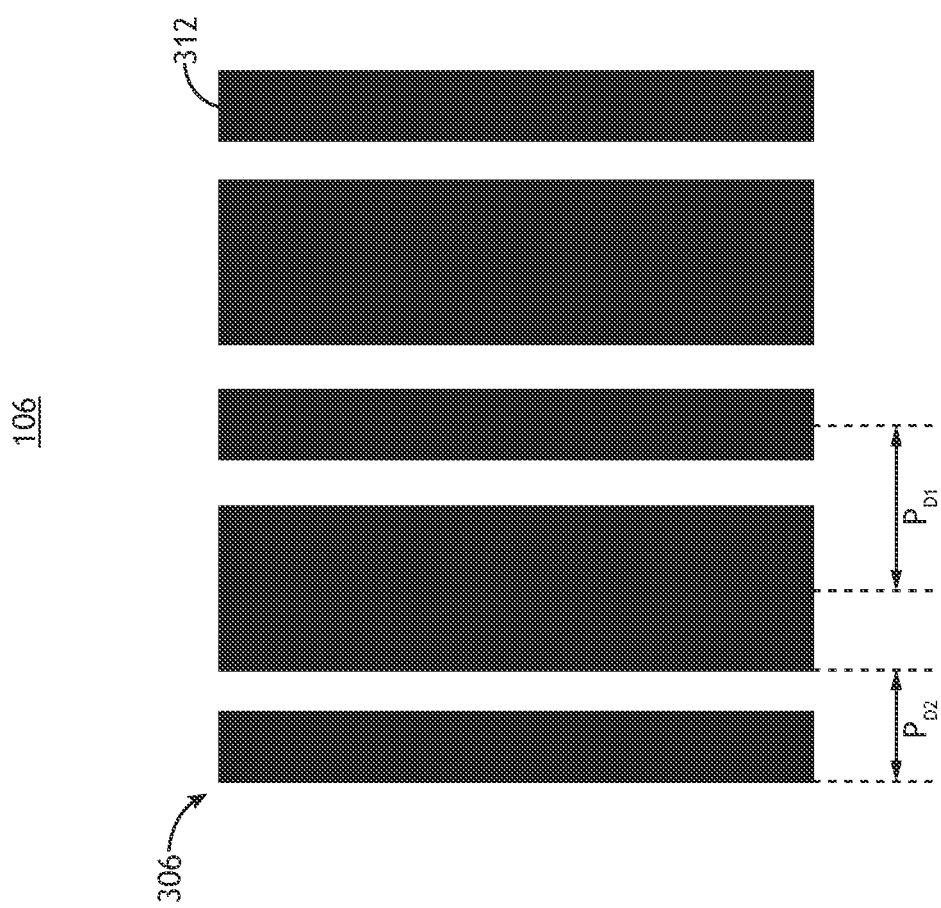
FIG. 3B is a top view of a double-pitch grating, in accordance with one or more embodiments of the present disclosure.
Figure 3C:
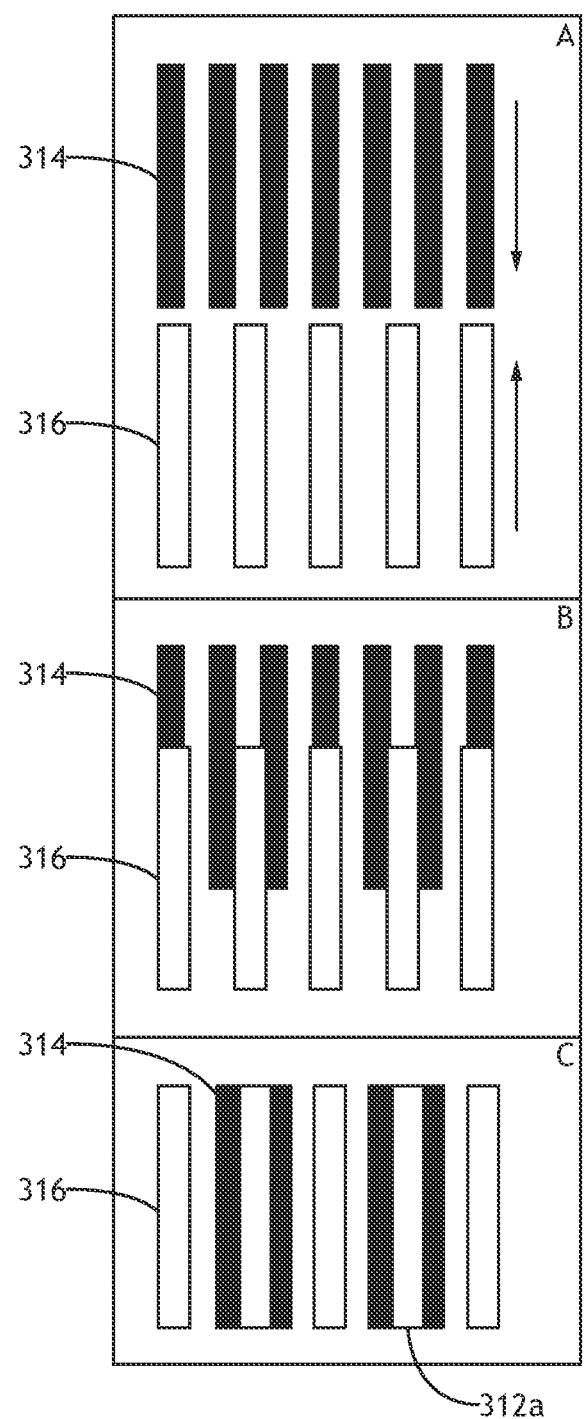
FIG. 3C provides a series of panels illustrating the conceptual formation of the double-pitch grating of FIG. 3B, in accordance with one or more embodiments of the present disclosure.
Figure 3E:
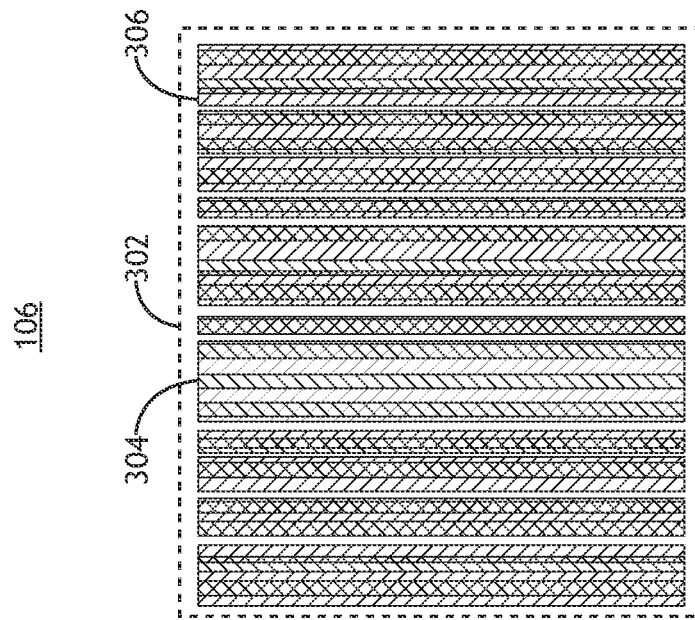
FIG. 3E is a top view of a cell of an overlay target in which a single-pitch grating and a double-pitch grating are printed on different layers of the sample within an overlapping area within the cell, in accordance with one or more embodiments of the present disclosure.
Figure 3D:
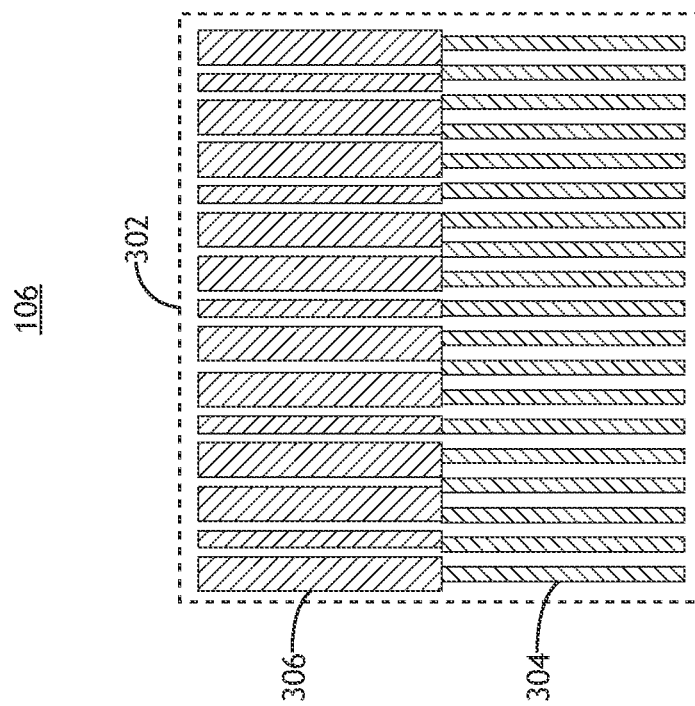
FIG. 3D is a top view of a cell of an overlay target in which a single-pitch grating and a double-pitch grating are printed in non-overlapping areas within the cell, in accordance with one or more embodiments of the present disclosure.
Figure 3F:
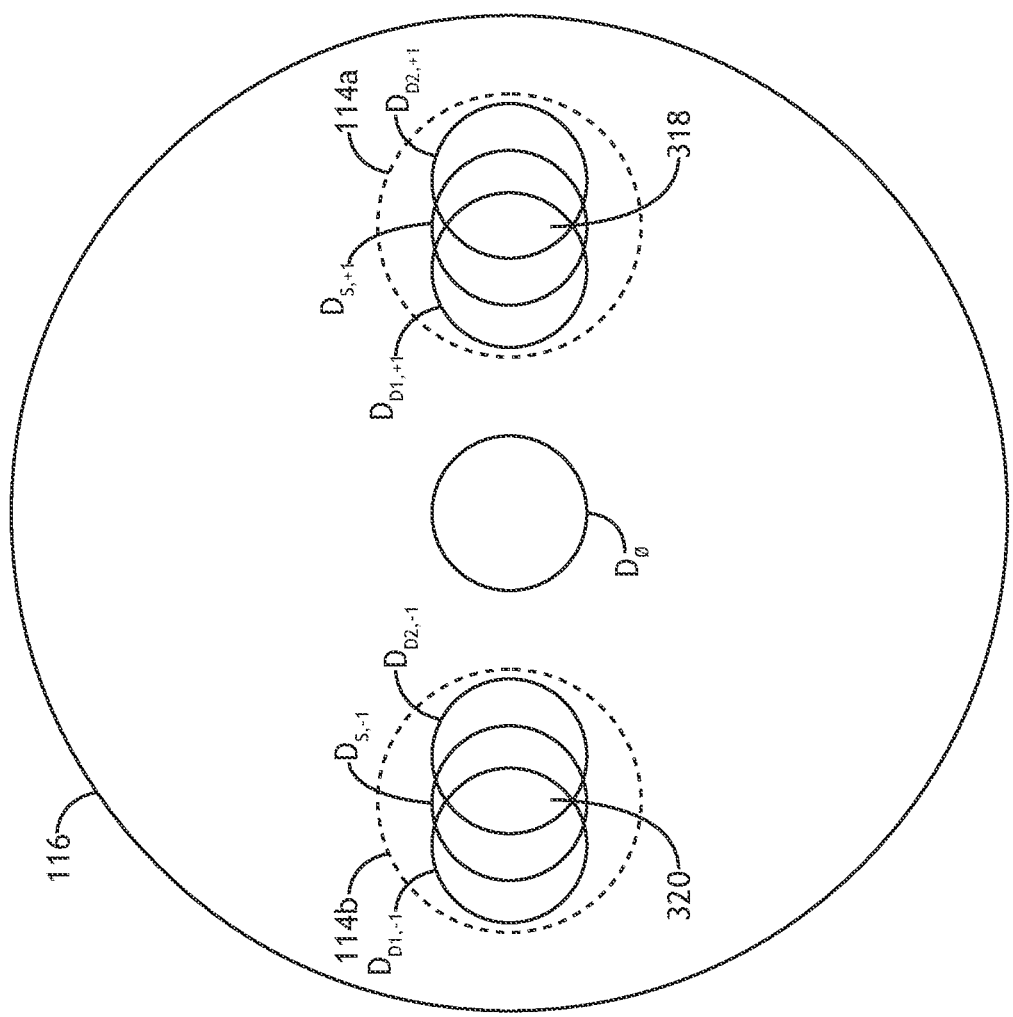
FIG. 3F is a conceptual view of a collection pupil plane of the overlay metrology tool including diffraction from a single-pitch grating and a double-pitch grating as illustrated in FIG. 3D or 3F, in accordance with one or more embodiments of the present disclosure.
Figure 4A:
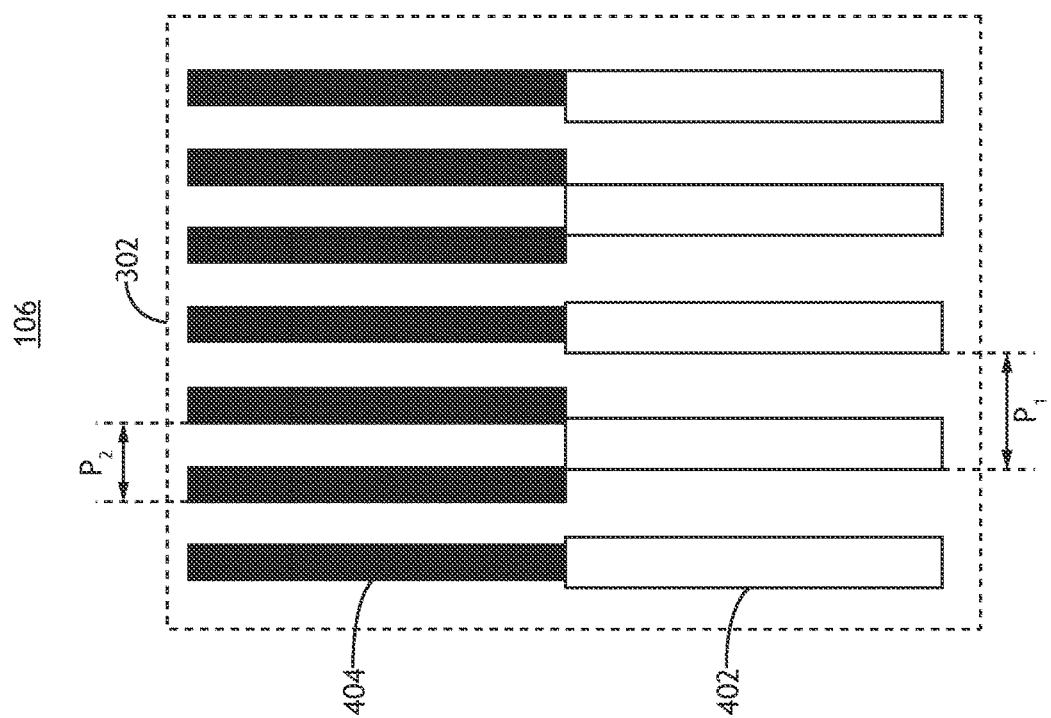
FIG. 4A is a top view of a cell of an overlay target with a first grating having a first pitch (P1) and a second grating having a second pitch (P2) different than the first pitch printed in non-overlapping areas within the cell, in accordance with one or more embodiments of the present disclosure.
Figure 4B:
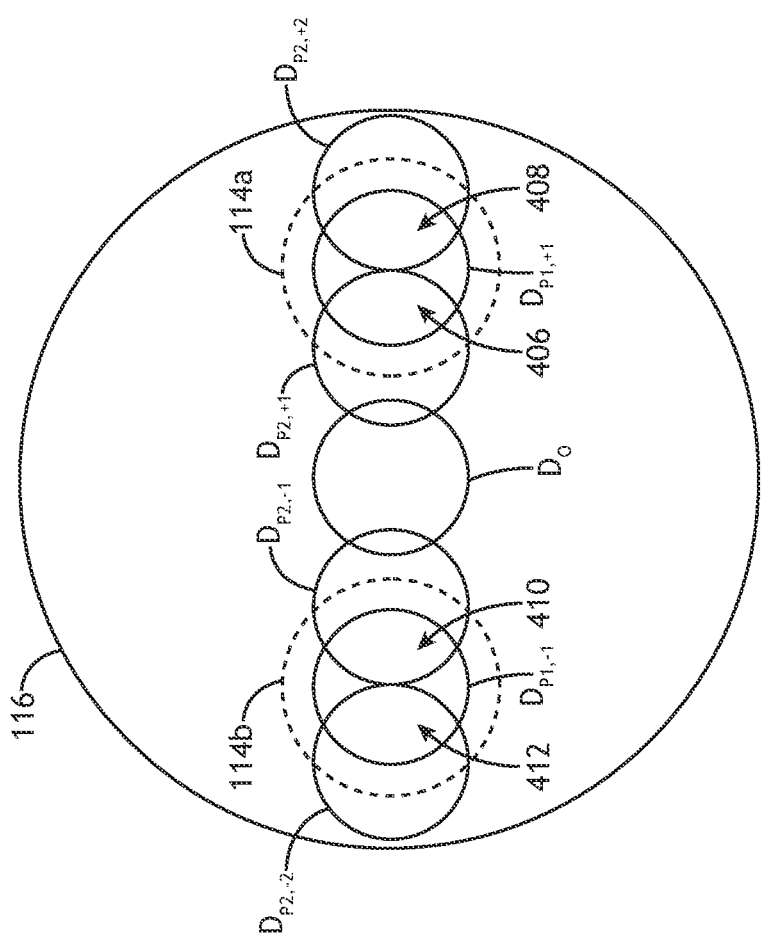
FIG. 4B is a conceptual view of a collection pupil plane of the overlay metrology tool including diffraction from a single-pitch grating and a double-pitch grating as illustrated in FIG. 4A, in accordance with one or more embodiments of the present disclosure.

Referring now to FIGS. 2-4B, the collection of diffraction orders from an overlay target 102 and the placement of the photodetectors 114 for single-cell scanning scatterometry overlay metrology is described in greater detail in accordance with one or more embodiments of the present disclosure. In particular, FIG. 2 illustrates a non-limiting illumination pupil distribution, FIGS. 3A-3F illustrate a first non-limiting design of an overlay target 102, and FIGS. 4A-4B illustrate a second non-limiting design of an overlay target 102.

FIG. 2 is a top view of an illumination pupil plane 128 of the overlay metrology tool 104 (e.g., as shown in FIG. 1B), in accordance with one or more embodiments of the present disclosure. In some embodiments, the illumination sub-system 108 illuminates the overlay target 102 with one or more illumination beams 110 at normal incidence (or near-normal incidence) as illustrated in FIG. 2A. For example, FIG. 2A illustrates the illumination beam 110 in a center of a pupil boundary 202 of the illumination pupil plane 128. Further, the one or more illumination beams 110 may illuminate the overlay target 102 with a limited range of incidence angles as illustrated by the limited size in the collection pupil plane 116. In this regard, the overlay target 102 may diffract the one or more illumination beams 110 into discrete diffraction orders.

It is recognized herein that the distribution of diffracted orders of an illumination beam 110 by a periodic structure in an overlay target 102 may be influenced by a variety of parameters such as, but not limited to, a wavelength of the illumination beam 110, an incidence angle of the illumination beam 110 in both altitude and azimuth directions, pitches of the gratings of an overlay target 102, or a numerical aperture (NA) of a collection lens. Accordingly, in embodiments of the present disclosure, the illumination sub-system 108, the collection sub-system 112, and the overlay target 102 may be configured to provide a desired distribution of diffraction orders in a collection pupil suitable for generating time-varying interference patterns indicative of overlay. For example, the illumination sub-system 108 and/or the collection sub-system 112 may be configured (e.g., using a measurement recipe) to generate measurements on overlay targets 102 having grating features with a selected range of pitches to provide a desired collection pupil distribution. Further, various components of the illumination sub-system 108 and/or the collection sub-system 112 (e.g., stops, pupils, or the like) may be adjustable (e.g., using a measurement recipe) to provide the desired collection pupil distribution.

Further, the sizes and shapes of diffraction orders in the collection pupil plane 116 may generally be related to the size and shape of an illumination beam 110 on the sample 106. For example, although not shown, in the case that the illumination beam 110 is elongated, the associated diffraction orders may similarly be elongated.

FIGS. 3A-3D illustrate a first non-limiting embodiment of an overlay target 102 suitable for single-cell scanning scatterometry overlay measurements in which a cell 302 includes a single-pitch grating 304 associated with a first lithographic exposure and a double-pitch grating 306 associated with a second lithographic exposure. In some embodiments, the single-pitch grating 304 is fabricated on a first layer and the double-pitch grating 306 is fabricated on a second layer. In this way, an associated overlay measurement may correspond to a measurement of the relative placement errors between the first and second layers. Further, the single-pitch grating 304 and/or the double-pitch grating 306 may be formed on fully processed layers or as a patterned photoresist layer. For example, one of the gratings may be formed on a fully processed layer and the other may be formed on a subsequently-exposed photoresist layer. In some embodiments, both the single-pitch grating 304 and the double-pitch grating 306 are formed on a single layer. In this way, the associated overlay measurement may correspond to a measurement of the relative placement errors between different exposures of a multi-exposure fabrication process (e.g., double patterning, or the like).

FIG. 3A is a top view of a single-pitch grating 304, in accordance with one or more embodiments of the present disclosure. In some embodiments, a single-pitch grating 304 includes a set of identical grating features 308 distributed along a measurement direction 310 with a selected pitch ($P_S$).

FIG. 3B is a top view of a double-pitch grating 306, in accordance with one or more embodiments of the present disclosure. In some embodiments, the double-pitch grating 306 is formed as a set of grating features 312 having two characteristic pitches ($P_{D1}$) and ($P_{D2}$). In this way, the grating features 312 may have varied sizes and relative positions to provide the pitches $P_{D1}$ and $P_{D2}$.

FIG. 3C provides a series of panels illustrating the conceptual formation of the double-pitch grating 306 of FIG. 3B, in accordance with one or more embodiments of the present disclosure. Panel A illustrates a first conceptual grating 314 with a first pitch ($P_{D1}$) and a second conceptual grating 316 with a second pitch ($P_{D2}$). Panels B and C illustrate the conceptual overlapping of first conceptual grating 314 with the second conceptual grating 316 in a common area. In this way, the grating features 312 may be formed as a combination of the first conceptual grating 314 and the second conceptual grating 316. It is to be understood, however, that the depictions in FIG. 3C are merely for illustrative purposes to clarify the layout of the double-pitch grating 306. In particular, the first conceptual grating 314 and the second conceptual grating 316 are not themselves fabricated, but are merely associated with the design of the double-pitch grating 306. As an illustration, the grating feature 312a is a single feature based on the combination of features from each of the first conceptual grating 314 and the second conceptual grating 316 as depicted in FIG. 3C.

FIGS. 3D and 3E illustrate non-limiting layouts of the single-pitch grating 304 and the double-pitch grating 306 within a cell 302 of an overlay target 102.

FIG. 3D is a top view of a cell 302 of an overlay target 102 in which a single-pitch grating 304 and a double-pitch grating 306 are printed in non-overlapping areas within the cell 302 (e.g., side by side), in accordance with one or more embodiments of the present disclosure. In this configuration, the single-pitch grating 304 and the double-pitch grating 306 may be fabricated on different layers of the sample 106 or on a common layer of the sample 106.

FIG. 3E is a top view of a cell 302 of an overlay target 102 in which a single-pitch grating 304 and a double-pitch grating 306 are printed on different layers of the sample 106 within an overlapping area within the cell 302, in accordance with one or more embodiments of the present disclosure. In this way, the cell 302 may include a variation of a grating-over-grating structure formed with the single-pitch grating 304 and the double-pitch grating 306.

Further, in both designs illustrated in FIGS. 3D and 3E, the illumination beam 110 may be simultaneously incident on both the single-pitch grating 304 and the double-pitch grating 306. In this way, the single-pitch grating 304 and the double-pitch grating 306 may simultaneously generate diffraction lobes associated with the pitch $P_S$ of the single-pitch grating 304 as well as the pitches $P_{D1}$ and $P_{D2}$ of the double-pitch grating 306. Further, although not shown, the illumination beam 110 may be elongated in a direction perpendicular to the measurement direction 310 to mitigate target-induced noise caused by imperfections in the cell 302 such as, but not limited to, roughness of the single-pitch grating 304 or the double-pitch grating 306.

FIG. 3F is a conceptual view of a collection pupil plane 116 of the overlay metrology tool 104 including diffraction from a single-pitch grating 304 and a double-pitch grating 306 as illustrated in FIG. 3D or 3F, in accordance with one or more embodiments of the present disclosure.

In some embodiments, the pitches associated with the cell 302 (e.g., the pitch $P_S$ of the single-pitch grating 304, the pitches $P_{D1}$ and $P_{D2}$ of the double-pitch grating 306, or the like) and/or various parameters in the metrology recipe (e.g., the wavelength of the illumination beam 110, or the like) are selected such that first-order diffraction lobes from each of the pitches $P_S$, $P_{D1}$ and $P_{D2}$ overlap. For example, FIG. 3F depicts the +1 order diffraction lobes $D_{S,+1}$, $D_{D1,+1}$, and $D_{D2,+1}$ associated with diffraction of the illumination beam 110 by the pitches $P_S$, $P_{D1}$ and $P_{D2}$, which overlap at a first overlap region 318. FIG. 3B further depicts the −1 order diffraction lobes $D_{S,-1}$, $D_{D1,-1}$, and $D_{D2,-1}$ associated with diffraction of the illumination beam 110 by the pitches $P_S$, $P_{D1}$ and $P_{D2}$, which overlap at a second overlap region 320. FIG. 3F also illustrates 0-order diffraction ($D_0$) (e.g., specular reflection).

It is contemplated herein that scanning the overlay target 102 with respect to the illumination beam 110 (or vice versa) along the measurement direction 310 will result in time-varying interference signals at the first overlap region 318 and the second overlap region 320 that are indicative of overlay errors between the first and second lithographic exposures associated with the single-pitch grating 304 and the double-pitch grating 306. Accordingly, in some embodiments, the overlay metrology tool 104 includes photodetectors 114 in the collection pupil plane 116 at the regions of overlap. For example, FIG. 3F illustrates a first photodetector 114a at the first overlap region 318 and a second photodetector 114 at the second overlap region 320.

Further, it is noted herein that the active area of the photodetectors 114 (e.g., as depicted by the dashed circles in FIG. 3F) may generally be any suitable size sufficient to capture the associated time-varying signals. For example, the active area of the photodetectors 114 may be larger than the associated overlap regions. In this configuration, the photodetectors 114 may capture additional signals beyond the relevant time-varying signals such as, but not limited to, constant signals. However, such signals may be filtered out or otherwise ignored using any technique known in the art.

In particular, the intensity measured at the photodetectors 114 is the product of all the fields associated with the three pitches $P_S$, $P_{D1}$ and $P_{D2}$:

$$I_{\pm 1} = \left| A_{P_S} e^{\pm \frac{2\pi i(x_0 - GP_S + vt)}{P_S} + i\Phi_1} + A_{P_{D1}} e^{\pm \frac{2\pi i(x_0 - GP_{D1} + vt)}{P_{D1}} + i\Phi_2} + A_{P_{D2}} e^{\pm \frac{2\pi i(x_0 - GP_{D2} + vt)}{P_{D2}} + i\Phi_3} \right|^2 \quad (1)$$

where $A_{P_S}$, $A_{P_{D1}}$, and $A_{P_{D2}}$ correspond to strengths of the diffraction orders associated with pitches $P_S$, $P_{D1}$ and $P_{D2}$, respectively. Further, GP represents grating position (e.g., along a scan).

Focusing only on the temporally-varying signal for the +1 diffraction lobes, one can write:

$$\tilde{I}_{\pm 1} = A_{P_S} A_{P_{D1}} e^{i\left\{ (\Phi_{P_S} - \Phi_{P_{D1}}) \pm 2\pi \left[ -\left( \frac{GP_S}{P_S} - \frac{GP_{D1}}{P_{D1}} \right) + (x_0 + vt)\left( \frac{1}{P_S} - \frac{1}{P_{D1}} \right) \right] \right\}} + \quad (2)$$
$$A_{P_{D1}} A_{P_{D2}} e^{i\left\{ (\Phi_{P_{D1}} - \Phi_{P_{D2}}) \pm 2\pi \left[ -\left( \frac{GP_{D1}}{P_{D1}} - \frac{GP_{D2}}{P_{D2}} \right) + (x_0 + vt)\left( \frac{1}{P_{D1}} - \frac{1}{P_{D2}} \right) \right] \right\}} + $$
$$A_{P_S} A_{P_{D2}} e^{i\left\{ (\Phi_{P_S} - \Phi_{P_{D2}}) \pm 2\pi \left[ -\left( \frac{GP_S}{P_S} - \frac{GP_{D2}}{P_{D2}} \right) + (x_0 + vt)\left( \frac{1}{P_S} - \frac{1}{P_{D2}} \right) \right] \right\}}.$$

Since the terms have different frequencies, these signals can be separated such that the phase differences of each of the components may be measured (e.g., by the controller 122). In the phase differences, a constant-phase contribution from the sample 106 may be eliminated such that the phase contribution comes from an initial pitch position (e.g., initial GP and associated initial phase of the illumination beam 110 from a starting location of a scan). The overlay may then be determined as:

$$\delta_{ij} = \frac{\psi_{ij}^+ - \psi_{ij}^-}{4\pi} = -\left( \frac{GP_i}{P_i} - \frac{GP_j}{P_j} \right) + (x_0 + vt)\left( \frac{1}{P_i} - \frac{1}{P_j} \right) \quad (3)$$

$$OVL = -\frac{P_{D1} P_S P_{D2}}{P_{D2} - P_{D1}} \left[ \delta_{D1,S} \frac{P_S - P_{D2}}{P_{D2} P_S} - \delta_{D2,S} \frac{P_S - P_{D1}}{P_{D1} P_S} \right] = \quad (4)$$
$$-\frac{P_{D2} P_{D1}}{P_{D2} - P_{D1}} \left[ \delta_{D1,S} \frac{P_S - P_{D2}}{P_{D2}} - \delta_{D2,S} \frac{P_S - P_{D1}}{P_{D1}} \right]$$

It is recognized herein that the determination of overlay depicted by equations (1)-(4) is similar to the approach for determining overlay using triple grating targets as described in U.S. patent application Ser. No. 17/119,536 filed on Dec. 11, 2020, which is incorporated herein by reference in its entirety. However, as described previously herein, measurement of an overlay target 102 with a single-pitch grating 304 and a double-pitch grating 306 as disclosed herein avoids unwanted edge effects and scattering associated with the triple grating design such that the systems and methods disclosed herein may provide overlay measurements with higher sensitivity than the triple grating approach.

Referring now to FIGS. 4A-4B, FIGS. 4A-4B illustrate a second non-limiting embodiment of an overlay target 102 suitable for single-cell scanning scatterometry overlay measurements in which a cell 302 includes two single-pitch gratings with different pitches.

FIG. 4A is a top view of a cell 302 of an overlay target 102 with a first grating 402 having a first pitch (P1) and a second grating 404 having a second pitch (P2) different than the first pitch printed in non-overlapping areas within the cell 302 (e.g., side by side), in accordance with one or more embodiments of the present disclosure. In a manner similar to the design illustrated in FIG. 3D, first grating 402 and the second grating 404 may be fabricated on a common layer or different layers of the sample 106. Further, although not shown, the first grating 402 and the second grating 404 may be fabricated on different layers of the sample 106 in an overlapping area to form a grating-over-grating structure (e.g., similar to the design illustrated in FIG. 3F). Further, in both configurations, the illumination beam 110 may be simultaneously incident on both the single-pitch grating 304 and the double-pitch grating 306.

FIG. 4B is a conceptual view of a collection pupil plane 116 of the overlay metrology tool 104 including diffraction from a single-pitch grating 304 and a double-pitch grating 306 as illustrated in FIG. 4A, in accordance with one or more embodiments of the present disclosure.

In some embodiments, the pitches associated with the cell 302 (e.g., the pitch $P_1$ of the first grating 402 and the pitch $P_2$ of the second grating 404) are selected and/or various parameters in the metrology recipe (e.g., the wavelength of the illumination beam 110, or the like) are selected such that first-order diffraction lobes from the first grating 402 overlap with portions of both first and second order diffraction lobes from the second grating 404.

For example, FIG. 4B depicts the +1 order diffraction lobe from the first grating 402 ($D_{P_1,+1}$) overlapping with a portion of the +1 order diffraction lobe from the second grating 404 ($D_{P_2,+1}$) in a first overlap region 406 and also overlapping with a portion of the +2 order diffraction lobe from the second grating 404 ($D_{P_2,+2}$) in a second overlap region 408. Similarly, FIG. 4B depicts the −1 order diffraction lobe from the first grating 402 ($D_{P_1,-1}$) overlapping with a portion of the −1 order diffraction lobe from the second grating 404 ($D_{P_2,-1}$) in a third overlap region 410 and also overlapping with a portion of the −2 order diffraction lobe from the second grating 404 ($D_{P_2,-2}$) in a fourth overlap region 412. FIG. 4B also illustrates 0-order diffraction ($D_0$) (e.g., specular reflection).

It is contemplated herein that scanning the overlay target 102 with respect to the illumination beam 110 (or vice versa) along the measurement direction 310 will result in time-varying interference signals at the overlap regions 406-412 that are indicative of overlay errors between the first and second lithographic exposures associated with the first grating 402 and the second grating 404. Accordingly, in some embodiments, the overlay metrology tool 104 includes photodetectors 114 in the collection pupil plane 116 at the areas of overlap. For example, FIG. 4B illustrates a first photodetector 114a capturing the first and second overlap regions 406,408 and a second photodetector 114b capturing the third and fourth overlap regions 410,412. It is contemplated herein that the overlay between the lithographic exposures forming the first grating 402 and the second grating 404 may be derived in a similar fashion as depicted in equations (1)-(4) for the design of the overlay target 102 depicted in FIGS. 3A-3F.

Further, in a manner similar to that described in FIG. 3F, it is noted herein that the active area of the photodetectors 114 (e.g., as depicted by the dashed circles in FIG. 4B) may generally be any suitable size sufficient to capture the associated time-varying signals. For example, the active area of the photodetectors 114 may be larger than the associated overlap regions. In this configuration, the photodetectors 114 may capture additional signals beyond the relevant time-varying signals such as, but not limited to, constant signals. However, such signals may be filtered out or otherwise ignored using any technique known in the art.

Referring now generally to FIGS. 3A-4B, it is noted that FIGS. 3A-4B describe various non-limiting designs of a particular cell 302 associated with a particular measurement direction 310. However, it is to be understood that an overlay target 102 may include any number of cells 302 along any number of different measurement directions which may have any orientations with respect to a direction of motion of the sample 106 (e.g., a stage scan direction provided by the translation stage 118) or a direction of motion of the illumination beam 110 (e.g., a beam scan direction provided by the beam-scanning sub-system 120). For example, it is contemplated herein that any of the arrangements of cells 302 and associated measurement configurations (e.g., stage scan directions or beam scan directions) provided in U.S. patent application Ser. No. 17/178,089 filed on Feb. 17, 2021 or U.S. patent Application No. 17,708,958 filed on Mar. 30, 2022, both of which are incorporated herein by reference in their entireties, may be extended to the cell designs disclosed herein.

Referring again to FIG. 1A, additional components of the overlay metrology tool 104 are described in greater detail in accordance with one or more embodiments of the present disclosure.

The photodetectors 114 may generally include any type of optical detector known in the art suitable for capturing interference signals generated as the sample 106 is translated by the translation stage 118 and/or as one or more illumination beams 110 are scanned by the beam-scanning sub-system 120. For example, the photodetectors 114 may include, but are not limited to, fast photodiodes, photomultipliers, or avalanche photodiodes.

In a general sense, the bandwidth or response time of the photodetectors 114 should be sufficient to resolve the temporal frequency of the interference fringes, which is related to the pitches of the constituent grating structures and the scanning speed along the measurement direction 310. For example, in the case of a scan speed along the measurement direction 310 of 10 centimeters per second and a target pitch of 1 micrometer, the interference signals will oscillate at a rate on the order of 100 kHz. In some embodiments, the photodetectors 114 include photodetectors having a bandwidth of at least 1 GHz. However, it is to be understood that this value is not a requirement. Rather, the bandwidth of the photodetectors 114, the translation speed along the measurement direction, and the pitch of the Moiré structures may be selected together to provide a desired sampling rate of the interference signal.

In some embodiments, the overlay metrology system 100 includes a controller 122 communicatively coupled to the overlay metrology tool 104. The controller 122 may include one or more processors 124 and a memory device 126, or memory. For example, the one or more processors 124 may be configured to execute a set of program instructions maintained in the memory device 126.

The one or more processors 124 of the controller 122 may generally include any processor or processing element known in the art. For the purposes of the present disclosure, the term "processor" or "processing element" may be broadly defined to encompass any device having one or more processing or logic elements (e.g., one or more microprocessor devices, one or more application specific integrated circuit (ASIC) devices, one or more field programmable gate arrays (FPGAs), or one or more digital signal processors (DSPs)). In this sense, the one or more processors 124 may include any device configured to execute algorithms and/or instructions (e.g., program instructions stored in memory). In some embodiments, the one or more processors 124 may be embodied as a desktop computer, mainframe computer system, workstation, image computer, parallel processor, networked computer, or any other computer system configured to execute a program configured to operate or operate in conjunction with the overlay metrology system 100, as described throughout the present disclosure. Moreover, different subsystems of the overlay metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 122 may include one or more controllers housed in a common housing or within multiple housings. In this way, any controller or combination of controllers may be separately packaged as a module suitable for integration into metrology overlay metrology system 100. Further, the controller 122 may analyze or otherwise process data received from the photodetectors 114 and feed the data to additional components within the overlay metrology system 100 or external to the overlay metrology system 100.

Further, the memory device 126 may include any storage medium known in the art suitable for storing program instructions executable by the associated one or more processors 124. For example, the memory device 126 may include a non-transitory memory medium. As an additional example, the memory device 126 may include, but is not limited to, a read-only memory, a random-access memory, a magnetic or optical memory device (e.g., disk), a magnetic tape, a solid-state drive and the like. It is further noted that memory device 126 may be housed in a common controller housing with the one or more processors 124.

In this regard, the controller 122 may execute any of various processing steps associated with overlay metrology. For example, the controller 122 may be configured to generate control signals to direct or otherwise control the overlay metrology tool 104, or any components thereof. For instance, the controller 122 may be configured to direct the translation stage 118 to translate the sample 106 along one or more measurement paths, or swaths, to scan one or more overlay targets through a measurement field of view of the overlay metrology tool 104 and/or direct the beam-scanning sub-system 120 to position or scan one or more illumination beams 110 on the sample 106. By way of another example, the controller 122 may be configured to receive signals corresponding to the time-varying interference signals from the photodetectors 114. By way of another example, the controller 122 may generate correctables for one or more additional fabrication tools as feedback and/or feed-forward control of the one or more additional fabrication tools based on overlay measurements from the overlay metrology tool 104.

In another embodiment, the controller 122 captures the interference signals detected by the photodetectors 114. The controller 122 may generally capture data such as, but not limited to, the magnitudes or the phases of the time-varying interference signals using any technique known in the art such as, but not limited to, one or more phase-locked loops. Further, the controller 122 may capture the interference signals, or any data associated with the interference signals, using any combination of hardware (e.g., circuitry) or software techniques.

In some embodiments, the controller 122 determines an overlay measurement between layers of the overlay target 102 along the measurement direction based on the comparison of the interference signals. For example, the controller 122 may compare the magnitudes and/or phases of the interference signals to generate an overlay measurement. For instance, U.S. Pat. No. 10,824,079 issued on Nov. 3, 2020 generally describes the electric field of diffracted orders in a collection pupil and further provides specific relationships between overlay and measured intensity in the pupil plane, which is incorporated herein by reference in its entirety generally describes the electric field of diffracted orders in a collection pupil and further provides specific relationships between overlay and measured intensity in the pupil plane. It is contemplated herein that the systems and methods disclosed herein may extend the teachings of U.S. Pat. No. 10,824,079 to time-varying interference signals captured by photodetectors placed in overlap regions as disclosed herein. In particular, it is contemplated herein that overlay on a sample may be proportional to asymmetries such as, but not limited to, a relative phase shift between the two time-varying interference signals. In another instance, the relative intensities of the diffraction orders in the pupil plane may be extracted from the time-varying interference signals. In this way, any overlay algorithm based on relative intensity differences of diffraction orders known in the art may be applied to generate an overlay measurement.

Further, the controller 122 may calibrate or otherwise modify the overlay measurement based on known, assumed, or measured features of the sample that may also impact the time-varying interference signals such as, but not limited to, sidewall angles or other sample asymmetries.

Referring again to FIG. 1B, various components of the overlay metrology tool 104 are described in greater detail in accordance with one or more embodiments of the present disclosure.

In some embodiments, the illumination sub-system 108 includes an illumination source 136 configured to generate at least one illumination beam 110. The illumination from the illumination source 136 may include one or more selected wavelengths of light including, but not limited to, ultraviolet (UV) radiation, visible radiation, or infrared (IR) radiation.

The illumination source 136 may include any type of illumination source suitable for providing at least one illumination beam 110. In some embodiments, the illumination source 136 is a laser source. For example, the illumination source 136 may include, but is not limited to, one or more narrowband laser sources, a broadband laser source, a supercontinuum laser source, a white light laser source, or the like. In this regard, the illumination source 136 may provide an illumination beam 110 having high coherence (e.g., high spatial coherence and/or temporal coherence). In some embodiments, the illumination source 136 includes a laser-sustained plasma (LSP) source. For example, the illumination source 136 may include, but is not limited to, an LSP lamp, an LSP bulb, or an LSP chamber suitable for containing one or more elements that, when excited by a laser source into a plasma state, may emit broadband illumination.

In some embodiments, the illumination sub-system 108 includes one or more optical components suitable for modifying and/or conditioning the illumination beam 110 as well as directing the illumination beam 110 to the sample 106. For example, the illumination sub-system 108 may include one or more illumination lenses 138 (e.g., to collimate the illumination beam 110, to relay an illumination pupil plane 128 and/or an illumination field plane 140, or the like). In some embodiments, the illumination sub-system 108 includes one or more illumination control optics 142 to shape or otherwise control the illumination beam 110. For example, the illumination control optics 142 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In some embodiments, the overlay metrology tool 104 includes an objective lens 144 to focus the illumination beam 110 onto the sample 106 (e.g., an overlay target with overlay target elements located on two or more layers of the sample 106).

In some embodiments, the illumination sub-system 108 illuminates the sample 106 with two or more illumination beams 110. Further, the two or more illumination beams 110 may be, but are not required to be, incident on different portions of the sample 106 (e.g., different cells of an overlay target) within a measurement field of view (e.g., a field of view of the objective lens 144). It is contemplated herein that the two or more illumination beams 110 may be generated using a variety of techniques. In some embodiments, the illumination sub-system 108 includes two or more apertures at an illumination field plane 140. In some embodiments, the illumination sub-system 108 includes one or more beamsplitters to split illumination from the illumination source 136 into the two or more illumination beams 110. In some embodiments, at least one illumination source 136 generates two or more illumination beams 110 directly. In a general sense, each illumination beam 110 may be considered to be a part of a different illumination channel regardless of the technique in which the various illumination beams 110 are generated.

In some embodiments, the collection sub-system 112 includes at least two photodetectors 114 (e.g., photodetectors 114*a,b*) located at a collection pupil plane 116 configured to capture light from the sample 106 (e.g., collected light 146), where the collected light 146 includes overlap regions providing time-varying interference signals during a scan (e.g., overlap regions 318,320 illustrated in FIG. 3F, overlap regions 406-412 illustrated in FIG. 4B, or the like). The collection sub-system 112 may include one or more optical elements suitable for modifying and/or conditioning the collected light 146 from the sample 106. In some embodiments, the collection sub-system 112 includes one or more collection lenses 148 (e.g., to collimate the illumination beam 110, to relay pupil and/or field planes, or the like), which may include, but are not required to include, the objective lens 144. In some embodiments, the collection sub-system 112 includes one or more collection control optics 150 to shape or otherwise control the collected light 146. For example, the collection control optics 150 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In some embodiments, the illumination sub-system 108 and the collection sub-system 112 may utilize the objective lens 144. For example, FIG. 1B illustrates a beamsplitter 152 used to couple an illumination beam 110 to the objective lens 144 for illumination of the sample 106 and also couple collected light 146 from the objective lens 144 to the photodetectors 114.

The overlay metrology tool 104 may include one or more collection channels 154. For example, as illustrated in FIG. 1B, the overlay metrology tool 104 may include one or more beamsplitters 156 arranged to split the collected light 146 into the collection channels 154. Further, FIG. 1B illustrates a configuration with two collection channels 154. It is contemplated herein that the photodetectors 114 may be distributed in any desired distribution between one or more collection channels 154. In some embodiments, each collection channel 154 includes a single photodetector 114 (e.g., photodetector 114a or photodetector 114b). In this way, each photodetector 114 may be placed at any location in the collection pupil plane 116 regardless of its physical size or any associated components. In some embodiments, multiple photodetectors 114 are located in at least one collection channel 154. In this configuration, multiple collection channels 154 may facilitate simultaneous measurements of different cells 302 (e.g., associated with different measurement directions).

In some embodiments, the collection sub-system 112 includes two or more photodetectors 114. In this way, the photodetectors 114 may be distributed as desired. For example, as illustrated in FIG. 1B, the overlay metrology tool 104 may include one or more beamsplitters 158 arranged to split the collected light 146 into the collection channels 154. Further, the beamsplitters 158 may be polarizing beamsplitters, non-polarizing beamsplitters, or a combination thereof. It is to be understood, however, that the illustration of two collection channels 154 in FIG. 1B is provided solely for illustrative purposes and should not be interpreted as limiting. For example, the collection sub-system 112 may include a single collection channel 154 or multiple collection channels 154.

In some embodiments, multiple collection channels 154 are configured to collect light from multiple illumination beams 110 on the sample 106. For example, in the case that an overlay target 102 has two or more cells 302 distributed in a direction different than a scan direction, the overlay metrology tool 104 may simultaneously illuminate the different cells 302 with different illumination beams 110 and simultaneously capture interference signals associated with each illumination beam 110. Additionally, in some embodiments, multiple illumination beams 110 directed to the sample 106 may have different polarizations. In this way, the diffraction orders associated with each of the illumination beams 110 may be separated. For example, polarizing beam-splitters 158 may efficiently separate the diffraction orders associated with the different illumination beams 110. By way of another example, polarizers may be used in one or more collection channels 154 to isolate desired diffraction orders for measurement.

In some embodiments, the overlay metrology tool 104 includes a beam-scanning sub-system 120 to position, scan, or modulate positions of one or more illumination beams 110 on the sample 106 during measurement.

The beam-scanning sub-system 120 may include any type or combination of elements suitable for scanning positions of one or more illumination beams 110. In some embodiments, the beam-scanning sub-system 120 includes one or more deflectors suitable for modifying a direction of an illumination beam 110. For example, a deflector may include, but is not limited to, a rotatable mirror (e.g., a mirror with adjustable tip and/or tilt). Further, the rotatable mirror may be actuated using any technique known in the art. For example, the deflector may include, but is not limited to, a galvanometer, a piezo-electric mirror, or a micro-electromechanical system (MEMS) device. By way of another example, the beam-scanning sub-system 120 may include an electro-optic modulator, an acousto-optic modulator, or the like.

The deflectors may further be positioned at any suitable location in the overlay metrology tool 104. In some embodiments, one or more deflectors are placed at one or more pupil planes common to both the illumination sub-system 108 and the collection sub-system 112. In this regard, the beam-scanning sub-system 120 may be a pupil-plane beam scanner and the associated deflectors may modify the positions of one or more illumination beams 110 on the sample 106 without impacting positions of diffraction orders in the collection pupil plane 116. Further, a distribution of one or more illumination beams 110 in an illumination field plane 140 may further be stable as the beam-scanning sub-system 120 modifies positions of the one or more illumination beams 110 on the sample 106. Pupil-plane beam scanning is described generally in U.S. patent application Ser. No. 17/142,783 filed on Jan. 6, 2021, which is incorporated by reference in its entirety.

Figure 5:
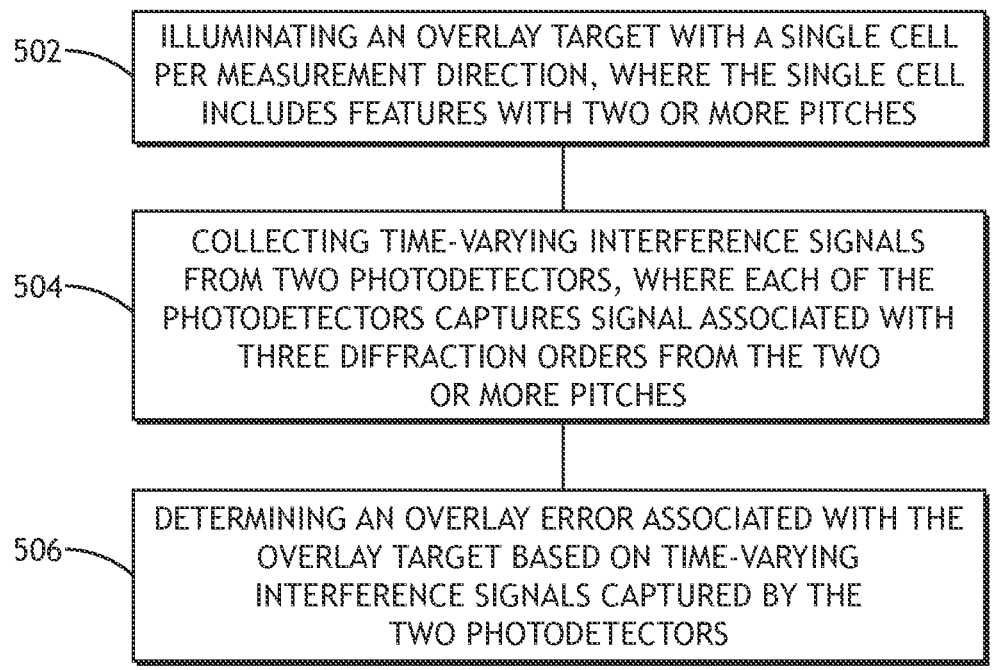
FIG. 5 is a flow diagram illustrating steps performed in a method for single-cell scanning overlay metrology, in accordance with one or more embodiments of the present disclosure.

Referring now to FIG. 5, FIG. 5 is a flow diagram illustrating steps performed in a method 500 for single-cell scanning overlay metrology, in accordance with one or more embodiments of the present disclosure. Applicant notes that the embodiments and enabling technologies described previously herein in the context of the overlay metrology system 100 should be interpreted to extend to the method 500. It is further noted, however, that the method 500 is not limited to the architecture of the overlay metrology system 100.

In some embodiments, the method 500 includes a step 502 of illuminating an overlay target with a single cell per measurement direction, where the single cell includes features with two or more pitches.

In some embodiments, the method 500 includes a step 504 of collecting time-varying interference signals from two photodetectors, where each of the photodetectors captures signal associated with three diffraction orders from the two or more pitches. For example, the overlay target may include a double-pitch grating characterized by two pitches on a first layer and single-pitch grating on a second layer. In this configuration, a first photodetector may capture +1 order diffraction from each of the three constituent pitches, while a second photodetector may capture −1 diffraction from each of the three constituent pitches. By way of another example, the overlay target may include single-pitch gratings with different pitches. In this configuration, a first photodetector may capture +1 order and +2 order diffraction from one of the single-pitch gratings and +1 diffraction from the other single-pitch grating, while a second photodetector may capture −1 order and −2 order diffraction from one of the single-pitch gratings and −1 diffraction from the other single-pitch grating.

In some embodiments, the method 500 includes a step 506 of determining an overlay error associated with the overlay target based on time-varying interference signals captured by the two photodetectors. For example, an overlay error along a direction of periodicity of the constituent grating structures may be determined based on any combination of intensity or phase information in the time-varying interference signals generated during a scan.

It is contemplated herein that the method 500 may be applied to a wide variety of overlay target designs suitable for 1D or 2D metrology measurements. In some embodiments, the method 500 includes simultaneously scanning multiple illumination beams and collecting the associated overlapping diffraction orders for parallel measurements. In some embodiments, the method 500 includes scanning one or more illumination beams along a beam-scan direction different than the stage-scan direction to provide a diagonal or triangle-wave path across the sample. In this regard, an overlay target with multiple cells suitable for determining overlay along different (e.g., orthogonal measurement may be efficiently interrogated by a common illumination beam in a measurement swath.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed is:

1. An overlay metrology system comprising:
   an illumination source;
   an illumination sub-system including one or more illumination optics to illuminate an overlay target on a sample with illumination from the illumination source as the sample is in motion with respect to the illumination from the illumination source in accordance with a measurement recipe, wherein the overlay target includes one or more cells in accordance with the measurement recipe, wherein at least some of the one or more cells comprise:
      a double grating including a first series of features distributed along a measurement direction with a first pitch and a second pitch in an overlapping region; and
      a single grating including a second series of features distributed along the measurement direction with the first pitch;
   a collection sub-system including one or more collection optics to direct positive and negative first-order diffraction of the illumination by both the double grating and the single gratings associated with the first and second pitches to one or more detectors located in a pupil plane in accordance with the measurement recipe, wherein the one or more detectors generate time-varying interference signals associated with the positive and negative first-order diffraction of the illumination by both the double grating and the single gratings; and
   a controller communicatively coupled to the one or more detectors, the controller including one or more processors to execute program instructions causing the one or more processors to determine an overlay measurement between the double grating and the single grating based on the time-varying interference signals.

2. The overlay metrology system of claim 1, wherein the double grating and the single grating overlap on the sample.

3. The overlay metrology system of claim 1, wherein the double grating and the single grating are located in adjacent non-overlapping regions of the sample.

4. The overlay metrology system of claim 1, wherein the double grating and the single grating are located in different layers of the sample.

5. The overlay metrology system of claim 1, wherein the double grating and the single grating are located in a common layer of the sample.

6. The overlay metrology system of claim 1, wherein the positive first-order diffraction associated with the first and second pitches overlap in a first overlap region at the pupil plane, wherein the negative first-order diffraction associated with the first and second pitches overlap in a second overlap region at the pupil plane, wherein determine the overlay measurement between the first and second layers of the sample based on the positive and negative first-order diffraction of the illumination by the double grating and the single grating associated with the first and second pitches comprises:
   determine an overlay measurement between the first and second layers of the sample based on time-varying interference signals generated by the one or more detectors at the first and second overlap regions.

7. The overlay metrology system of claim 1, wherein the double grating is fabricated in a single exposure step.

8. An overlay target comprising:
   one or more cells on a sample, wherein at least some of the one or more cells comprise:
      a double grating including a first series of features distributed along a measurement direction with a first pitch and a second pitch in an overlapping region; and
      a single grating on a second layer of the sample including a second series of features distributed along the measurement direction with the first pitch, wherein the first and second pitches are selected such that positive first-order diffraction from the first and second pitches overlap in a first overlap angular region and negative first-order diffraction from the first and second pitches overlap in a second overlap angular region for at least one operational wavelength, wherein time-varying interference signals in the first and second overlap regions generated as the overlay target is scanned relative to an illumination beam are indicative of overlay between the double grating and the single grating.

9. The overlay target of claim 8, wherein the double grating is fabricated in a single exposure step.

10. The overlay target of claim 8, wherein the first layer is fabricated prior to the second layer.

11. The overlay target of claim 8, wherein the first layer is fabricated subsequent to the second layer.

12. The overlay target of claim 8, wherein the double grating and the single grating are located in different layers of the sample.

13. The overlay target of claim 8, wherein the double grating and the single grating are located in a common layer of the sample.

14. An overlay metrology system comprising:
an illumination source;
an illumination sub-system including one or more illumination optics to illuminate an overlay target on a sample with illumination from the illumination source as the sample is in motion with respect to the illumination from the illumination source in accordance with a measurement recipe, wherein the overlay target includes one or more cells in accordance with the measurement recipe, wherein at least some of the one or more cells comprise:
a first grating on a first layer of the sample including a first series of features distributed along a measurement direction with a first pitch; and
a second grating on a second layer of the sample including a second series of features distributed along the measurement direction with a second pitch different than the first pitch; and
a collection sub-system including one or more collection optics to direct measurement diffraction orders to one or more detectors at a pupil plane in accordance with the measurement recipe, wherein the measurement diffraction orders comprise:
positive and negative first-order diffraction of the illumination by the first grating;
positive and negative first-order diffraction and second-order diffraction of the illumination by the second grating; and
a controller communicatively coupled to the one or more detectors, the controller including one or more processors to execute program instructions causing the one or more processors to determine an overlay measurement between the first and second layers of the sample based on the measurement diffraction orders.

15. The overlay metrology system of claim 14, wherein the positive first-order diffraction from the first grating overlaps with the positive first and second order diffraction from the second grating in a first set of overlap regions, wherein the negative first-order diffraction from the first grating overlaps with the negative first and second order diffraction from the second grating in a second set of overlap regions, wherein determine the overlay measurement between the first and second layers of the sample based on the measurement diffraction orders comprises:
determine the overlay measurement between the first and second layers of the sample based on time-varying interference signals generated by the one or more detectors at the first and second sets of overlap regions as the sample is in motion in accordance with the measurement recipe.

16. The overlay metrology system of claim 14, wherein the double grating and the single grating overlap on the sample.

17. The overlay metrology system of claim 14, wherein the double grating and the single grating are located in adjacent non-overlapping regions of the sample.

18. The overlay metrology system of claim 14, wherein the first layer is fabricated prior to the second layer.

19. The overlay metrology system of claim 14, wherein the first layer is fabricated subsequent to the second layer.

20. An overlay target comprising:
one or more cells on a sample, wherein at least some of the one or more cells comprise:
a first grating on a first layer of the sample including a first series of features distributed along a measurement direction with a first pitch; and
a second grating on a second layer of the sample including a second series of features distributed along the measurement direction with a second pitch different than the first pitch, wherein the first and second pitches are selected such that positive first-order diffraction from the first grating overlaps with positive first and second order diffraction from the second grating in a first set of overlap regions, wherein the negative first-order diffraction from the first grating overlaps with negative first and second order diffraction from the second grating in a second set of overlap regions, wherein time-varying interference signals in the first and second sets of overlap regions are indicative of overlay between the first and second layers of the sample.

21. The overlay target of claim 20, wherein the first layer is fabricated prior to the second layer.

22. The overlay target of claim 20, wherein the first layer is fabricated subsequent to the second layer.

* * * * *